United States Patent
Nelson et al.

(10) Patent No.: US 8,803,227 B2
(45) Date of Patent: *Aug. 12, 2014

(54) VERTICAL TRANSISTOR HAVING REDUCED PARASITIC CAPACITANCE

(75) Inventors: Shelby F. Nelson, Pittsford, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 341 days.

This patent is subject to a terminal disclaimer.

(21) Appl. No.: 13/248,488

(22) Filed: Sep. 29, 2011

(65) Prior Publication Data

US 2013/0082746 A1    Apr. 4, 2013

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/06* | (2006.01) |

(52) U.S. Cl.
USPC .......................................... 257/329; 257/623

(58) Field of Classification Search
CPC ............... H01L 29/78624; H01L 29/78642; H01L 79/78696; Y10S 257/90
USPC ................................. 257/329, 623
See application file for complete search history.

(56) References Cited

U.S. PATENT DOCUMENTS

| | | | |
|---|---|---|---|
| 5,283,455 A * | 2/1994 | Inoue et al. ................ | 257/329 |
| 5,641,694 A | 6/1997 | Kenney | |
| 5,766,988 A | 6/1998 | Cho et al. | |
| 6,458,633 B1 * | 10/2002 | Cho ............................... | 438/149 |
| 6,632,741 B1 * | 10/2003 | Clevenger et al. ............ | 438/689 |
| 6,746,904 B2 | 6/2004 | Van der Zaag et al. | |
| 6,972,461 B1 | 12/2005 | Chen et al. | |
| 7,413,982 B2 | 8/2008 | Levy | |
| 7,456,429 B2 | 11/2008 | Levy | |
| 7,571,529 B2 | 8/2009 | Sirringhaus et al. | |
| 7,586,130 B2 | 9/2009 | Kawashima et al. | |
| 7,588,971 B2 | 9/2009 | Wang et al. | |
| 7,592,218 B2 | 9/2009 | Brown | |
| 7,629,633 B2 | 12/2009 | Chan et al. | |

(Continued)

FOREIGN PATENT DOCUMENTS

| | | |
|---|---|---|
| JP | 63-170971 | 7/1988 |
| JP | 2-140863 | 11/1990 |

(Continued)

OTHER PUBLICATIONS

U.S. Appl. No. 12/986,241, filed Jan. 7, 2011, entitled "Transistor Including Multi-Layer Reentrant Profile", Tutt et al.

*Primary Examiner* — Howard Weiss
(74) *Attorney, Agent, or Firm* — William R. Zimmerli

(57) ABSTRACT

A transistor includes a substrate and an electrically conductive material layer stack positioned on the substrate. The electrically conductive material layer stack includes a reentrant profile. A first electrically insulating material layer positioned is in contact with a first portion of the electrically conductive material layer stack. A second electrically insulating material layer is conformally positioned in contact with the first electrically insulating layer, and conformally positioned in contact with a second portion of the electrically conductive material layer stack, and conformally positioned in contact with at least a portion of the substrate.

14 Claims, 11 Drawing Sheets

(56) References Cited

U.S. PATENT DOCUMENTS

| | | |
|---|---|---|
| 7,872,303 B2 * | 1/2011 | Chan et al. .................... 257/329 |
| 7,923,313 B1 | 4/2011 | Tutt et al. |
| 7,985,684 B1 | 7/2011 | Tutt et al. |
| 2005/0164464 A1 | 7/2005 | Hecht et al. |
| 2006/0063351 A1 | 3/2006 | Jain |
| 2006/0131697 A1 | 6/2006 | Wu et al. |
| 2007/0131998 A1 | 6/2007 | Lin et al. |
| 2008/0149913 A1 | 6/2008 | Tanaka et al. |
| 2008/0166884 A1 | 7/2008 | Nelson et al. |
| 2008/0227301 A1 | 9/2008 | Fang et al. |
| 2009/0001470 A1 | 1/2009 | Anderson et al. |
| 2009/0032803 A1 | 2/2009 | Appenzeller et al. |
| 2009/0085133 A1 | 4/2009 | Doan |
| 2009/0130858 A1 | 5/2009 | Levy |
| 2009/0166725 A1 | 7/2009 | Lee |

FOREIGN PATENT DOCUMENTS

| | | |
|---|---|---|
| JP | 05-144744 | 6/1993 |
| JP | 2005-203395 | 7/2005 |
| JP | 2007-284766 | 11/2007 |
| JP | 2008-103636 | 5/2008 |
| KR | 2009-0017045 | 2/2009 |
| KR | 2009-0017046 | 2/2009 |
| WO | WO 89/05516 | 6/1989 |

* cited by examiner

VERTICAL TRANSISTOR HAVING REDUCED PARASITIC CAPACITANCE

CROSS REFERENCE TO RELATED APPLICATIONS

Reference is made to commonly-assigned, U.S. patent application Ser. No. 13/248,518, entitled "PRODUCING VERTICAL TRANSISTOR HAVING REDUCED PARASITIC CAPACITANCE", filed concurrently herewith.

FIELD OF THE INVENTION

This invention relates generally to semiconductor devices, and in particular to transistor devices.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

High current semiconductor devices manufactured by techniques capable of producing small device features by using vertical or inclined walls have been produced. In some cases, the resulting devices comprise two electrodes, one serving as a gate and another as either a source or a drain electrode, positioned in a manner to create a parasitic capacitor by the overlap between them. In the more common planar devices, the problem of overlap can be solved by such techniques as self-aligned gates. In vertical architectures, a high precision alignment to the vertical wall can reduce the amount of overlap in some cases.

A need exists, however, for manufacturing techniques for semiconductor devices comprising vertical or inclined walls that do not require high precision alignments that reduce the overlap capacitance between electrodes. There is also a need to provide processes with fewer steps, to reduce the time and cost of manufacture.

SUMMARY OF THE INVENTION

According to one aspect of the present invention, a transistor includes a substrate and an electrically conductive material layer stack positioned on the substrate. The electrically conductive material layer stack includes a reentrant profile. A first electrically insulating material layer is positioned in contact with a first portion of the electrically conductive material layer stack. A second electrically insulating material layer is conformally positioned in contact with the first electrically insulating layer, and is conformally positioned in contact with a second portion of the electrically conductive material layer stack, and is conformally positioned in contact with at least a portion of the substrate.

According to another aspect of the present invention, a method of actuating a semiconductor device includes providing a transistor. The transistor includes a substrate and an electrically conductive material layer stack positioned on the substrate. The electrically conductive material layer stack includes a reentrant profile. A first electrically insulating material layer is positioned in contact with a first portion of the electrically conductive material layer stack. A second electrically insulating material layer is conformally positioned in contact with the first electrically insulating layer, and is conformally positioned in contact with a second portion of the electrically conductive material layer stack, and is conformally positioned in contact with at least a portion of the substrate. A semiconductor material layer that is conformally positioned in contact with the second electrically insulating material layer. A first electrode and a second electrode are in contact with the semiconductor material layer. A voltage is applied between the first electrode and the second electrode. A voltage is applied to the electrically conductive material layer stack to electrically connect the first electrode and the second electrode.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

Figure 1:
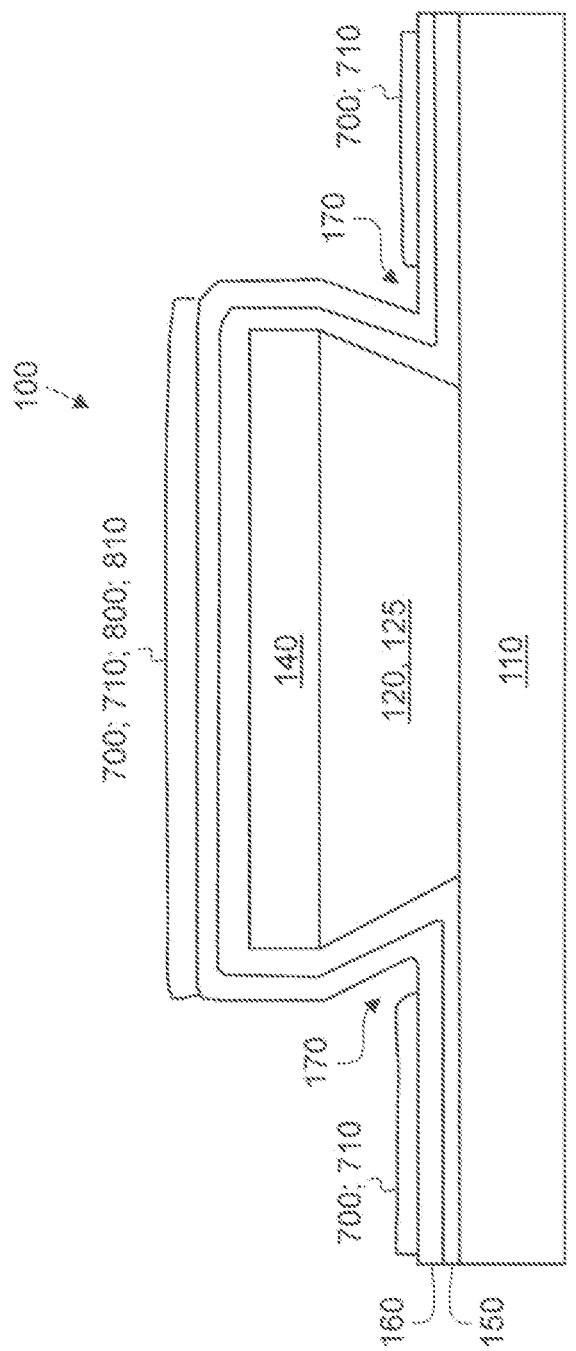
FIG. 1 is a schematic cross sectional view of an example embodiment of a vertical transistor made in accordance with the present invention.

The present description will be directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements.

The example embodiments of the present invention are illustrated schematically and not to scale for the sake of clarity. One of the ordinary skills in the art will be able to readily determine the specific size and interconnections of the elements of the example embodiments of the present invention.

Referring to FIG. 1, a schematic cross sectional view of a vertical transistor 100 is shown. Transistor 100 includes a substrate 110, an electrically conductive material layer stack 120, and a first electrically insulating layer 140. Transistor 100 also includes a second electrically insulating material layer 150 and a semiconductor material layer 160. An electrode or electrodes 710 and an electrode 810 are also included in transistor 100.

Conductive layer stack 120 is positioned above substrate 110 such that a first surface of conductive layer stack 120 contacts a first surface of substrate 110. Substrate 110, often referred to as a support, can be rigid or flexible.

Electrically conductive material layer stack 120 is appropriately etched (or shaped) to create a reentrant profile 170 in transistor 100. The reentrant profile 170 shields at least some of the electrically conductive material layer stack 120 from material deposited (or coated) using a directional (or line of sight) deposition (or coating) process. In other words, the reentrant profile 170 of the electrically conductive material layer stack 120 includes a first portion of electrically conductive material layer stack 120 that overhangs a second portion of electrically conductive material layer stack 120.

A first electrically insulating layer 140 is positioned in contact with a first surface of the electrically conductive material layer stack 120. A second electrically insulating material layer 150 conforms to the reentrant profile 170 of transistor 100, and to the exposed surfaces of electrically insulating layer 140. Electrically insulating material layer 150 includes first and second surfaces with the first surface being in contact with portions of surfaces of the electrically conductive layer stack 120, of the first electrically insulating layer 140, and of the substrate 110. Semiconductor material layer 160 conforms to electrically insulating material layer 150. Semiconductor layer 160 includes first and second surfaces with the first surface being in contact with the second surface of electrically insulating layer 150. Distinct (or separate, or different) portions of the second surface of semiconductor layer 160 are in contact with electrode(s) 710 and electrode 810.

Electrode(s) 710 includes a second electrically conductive material layer 700. When there is more than one electrode 710, different discrete discontinuous portions of second electrically conductive material layer 700 form electrodes 710. Electrode 810 includes a third electrically conductive material layer 800. Electrode(s) 710 and electrode 810 are positioned or spaced apart from each other at different locations of transistor 100. Electrode(s) 710 and electrode 810 can be different portions of the same material layer (either material layer 700 or material layer 800). When this happens, the second and third electrically conductive material layers 700 and 800 are different discrete discontinuous portions of the same material layer, for example, material layer 700. The material layer, for example, layer 700, is preferably deposited in a single collimated deposition during which reentrant profile 170 electrically separates each electrode from the other electrodes such that electrode(s) 710 and electrode 810 are included on distinct (different) discontinuous portions of the same electrically conductive material layer. Alternatively, the second and the third electrically conductive material layers 700, 800 can be distinct (different) material layers that are used to form electrode(s) 710 and 810.

Electrically conductive material layer stack 120 functions as the gate 125 of transistor 100. In some example embodiments of transistor 100, one or both of electrodes 710 function as the drain of transistor 100 while electrode 810 functions as the source of transistor 100. In other example embodiments of transistor 100, one or both of electrodes 710 function as the source while electrode 810 functions as the drain.

The semiconductor device is actuated in the following manner. After transistor 100 is provided, a voltage is applied between the second electrically conductive material layer 700 and the third electrically conductive material layer 800. A voltage is also applied to the first electrically conductive material layer stack 120 to electrically connect the second electrically conductive material layer 700 (electrode 710) and the third electrically conductive material layer 800 (electrode 810). As described above, the second electrically conductive material layer 700 and the third electrically conductive material layer 800 can be different portions of the same material layer or can be different material layers.

The reentrant profile 170 of transistor 100 allows a dimension of the semiconductor material channel of the transistor to be associated with the thickness of the first electrically conductive material layer stack 120, which functions as the gate 125 of transistor 100. Advantageously, this architecture of the present invention reduces reliance on high resolution or very fine alignment features during the manufacture of transistors that include small channels.

The first electrically insulating layer 140, the second electrically insulating layer 150, and the semiconductor material layer 160 separate the third electrically conductive material layer 800 (electrode 810) from the first electrically conductive layer stack 120. Advantageously, the additional separation resulting from the first electrically insulating layer 140 thickness reduces the parasitic capacitance between the two electrodes.

Referring to FIGS. 2 through 10, schematic cross sectional views of process steps associated with an example embodiment of a method of manufacturing transistor 100 are shown.

Generally described, transistor 100 is fabricated in the following manner. A substrate 110 is provided including an electrically conductive material layer stack 120. An electrically insulating material layer 140, for example, a resist material, is deposited over the electrically conductive material layer stack 120. Electrically insulating material layer 140 is patterned to expose a portion of electrically conductive material layer stack 120, shown in FIG. 2. If desired, the electrically insulating material layer 140 can be deposited over second electrically conductive material layer stack 120 and patterned in the same process step.

Figure 3:
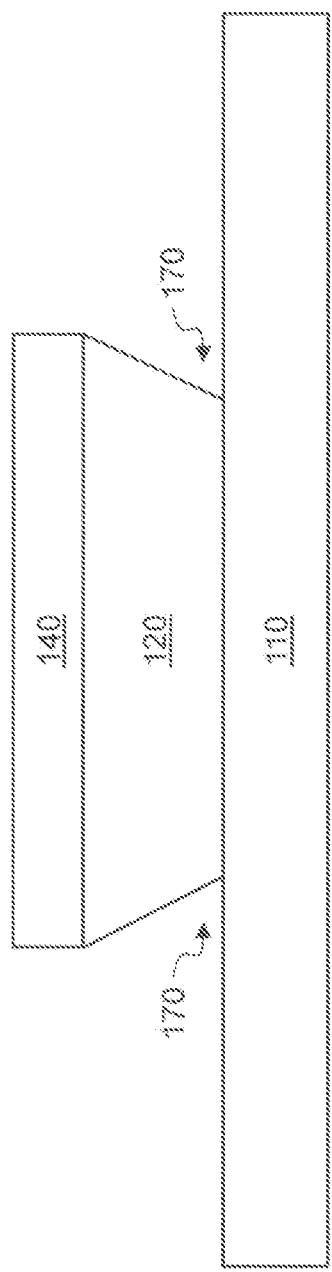

The exposed portion of electrically conductive material layer stack 120 is removed using a process which tends to create a reentrant profile in the electrically conductive material layer stack 120, as shown in FIG. 3. A plasma etching process is one example of a process which causes a portion of electrically conductive material layer stack 120 to overhang a different portion of electrically conductive material layer stack 120 in order to create reentrant profile 170. Selective wet etches can also be used to create the reentrant profile 170 in electrically conductive layer stack 120.

Figure 6:
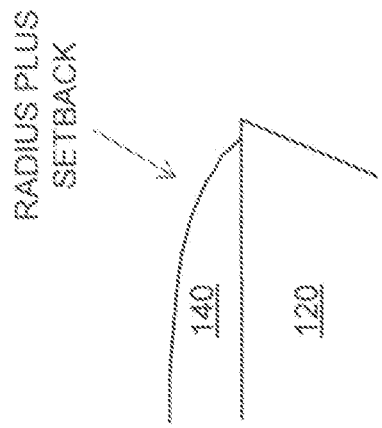
Figure 5:
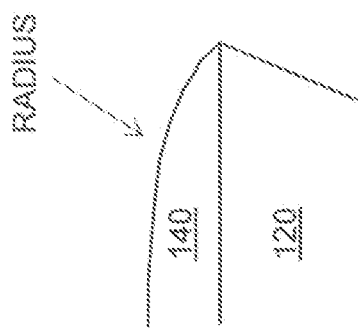
Figure 4:
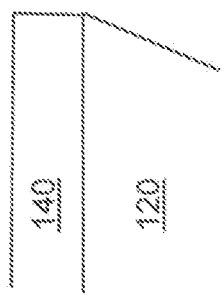

The profile of the electrically insulating material layer 140 can assume several shapes. FIG. 4 shows a sharp profile with vertical side walls. This profile can be maintained through a variety of elevated temperature processing steps depending on the material selected for electrically insulating material layer 140. For example, when electrically insulating material layer 140 is a resist including cross linkers, the profile can be maintained. FIG. 5 shows a profile in which electrically insulating material layer 140 has reflowed after exposure to an elevated temperature step, giving rise to a radius of curvature in the electrically insulating material layer 140. The profile illustrated in FIG. 5 can be further modified, for example, by etching in an oxygen plasma. In such a case a portion of the first surface of electrically conducting layer stack 120 is exposed at the edge near the reentrant profile 170, as illustrated in FIG. 6. For simplicity, the abrupt profile shown in FIG. 4 is carried through the ensuing process figures.

If desired, the electrically insulating material layer 140 can be stripped at this point, and another electrically insulating material layer applied to replace it. For example, a photoresist can be used to pattern the conductive material layer stack 120 and then replaced with an inorganic material, for example, an aerogel, that has preferred dielectric properties. Alignment to the electrically conductive layer stack 120 can be achieved, for instance, if the electrically conductive layer stack 120 is opaque, by a backside exposure using the electrically conductive layer stack 120 as a mask. In the following figures, the electrically insulating material layer is labeled 140 regardless of whether the original electrically insulating material layer is kept, or is removed and a new one is applied.

Figure 7:
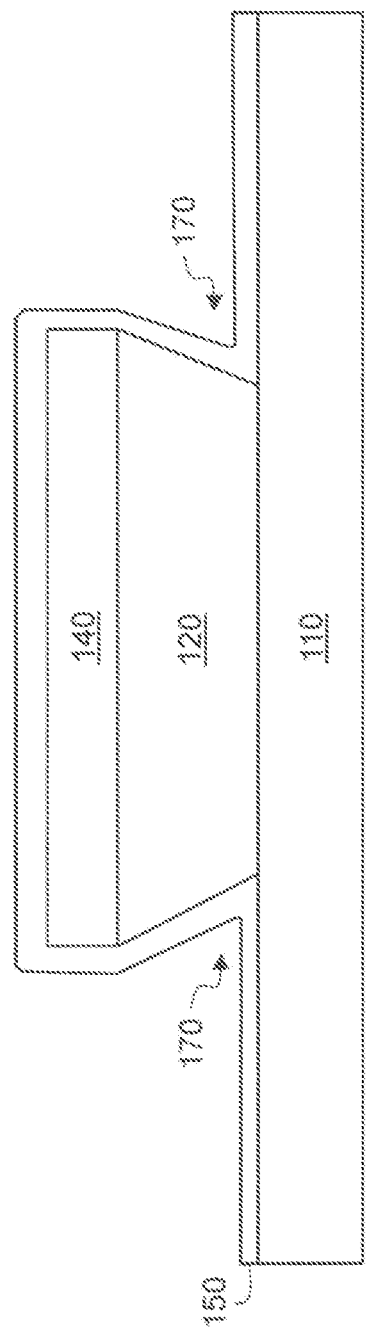
Figure 8:
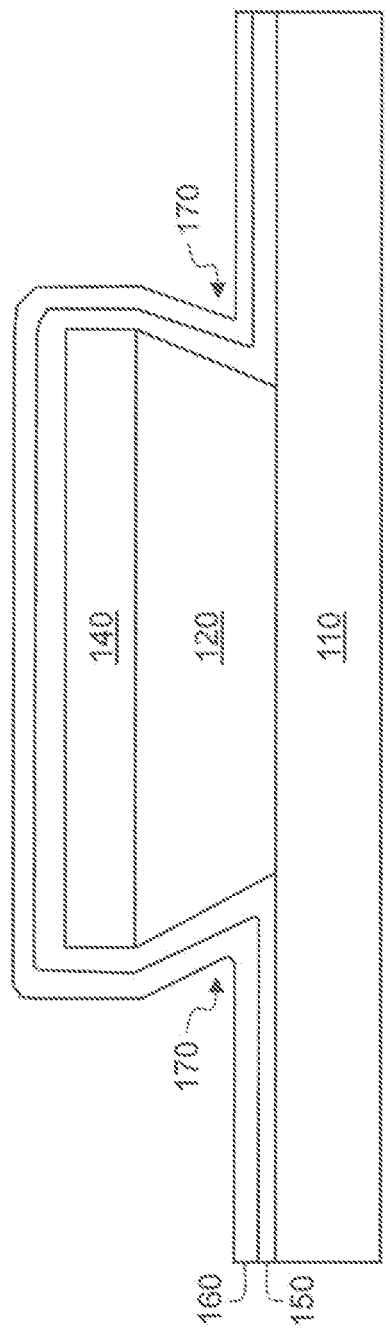
Figure 9:
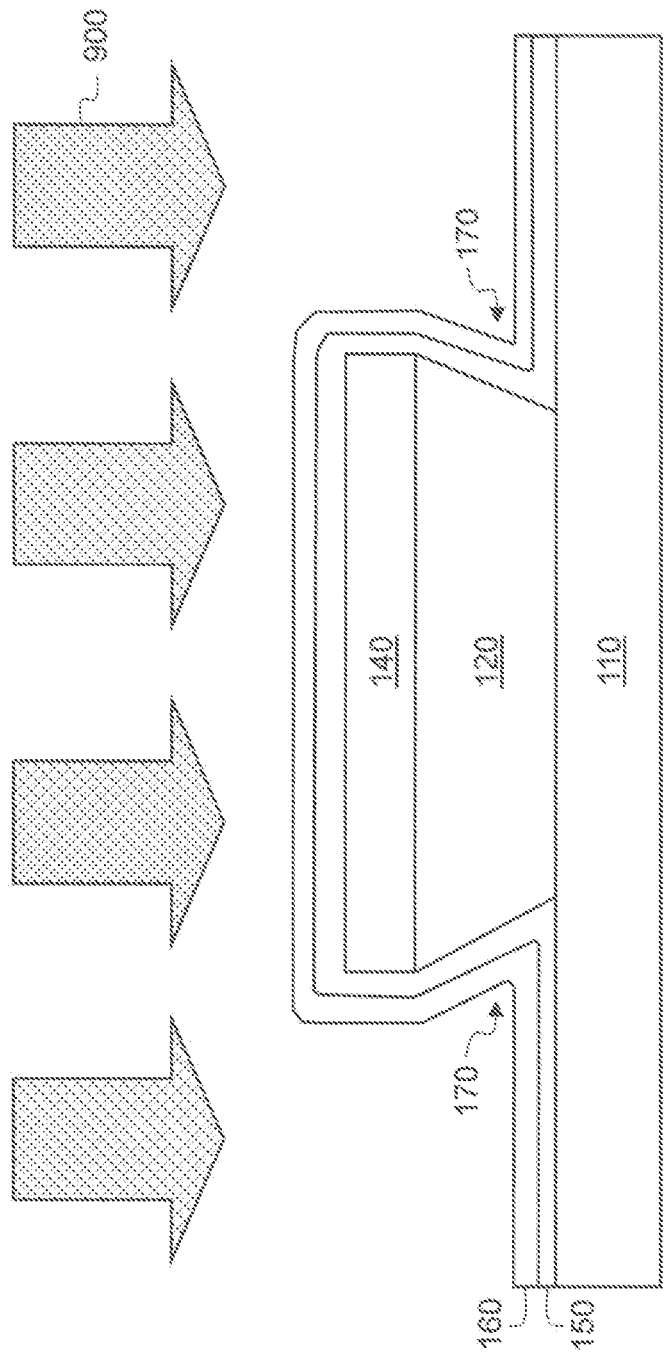
Figure 10:
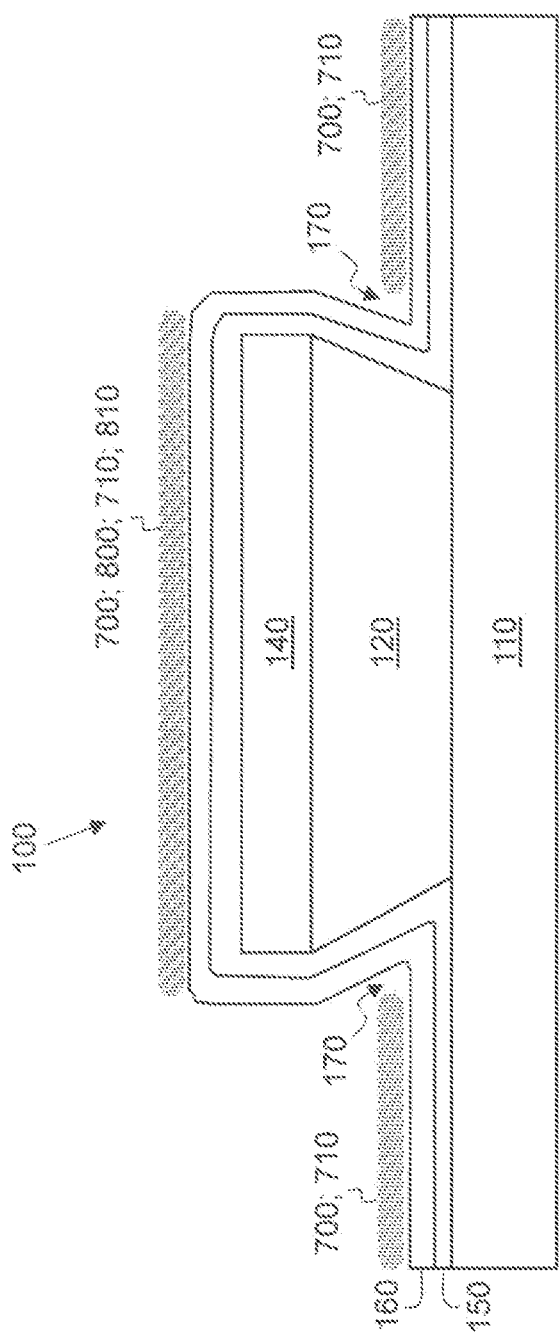

After establishing the reentrant profile 170, substrate 110, the remaining exposed portions of electrically conductive material layer stack 120, and the exposed portions of electrically insulating material layer 140 are conformally coated with an electrically insulating material layer 150, shown in FIG. 7. Electrically insulating material layer 150 is conformally coated with a semiconductor material layer 160, as shown in FIG. 8. An electrically conductive material layer, for example, material layer 700 or material layer 700 and material layer 800, is directionally (or nonconformally) deposited (shown using arrows 900) over semiconductor material layer 160, as shown in FIG. 9, in order to create electrode(s) 710 or electrode 810, shown in FIG. 10.

In some example embodiments, substrate 110 can include more than one material layer. The additional material layer(s) is included in some instances to improve or maintain the structural integrity of substrate 110 during the manufacturing process. When substrate 110 includes more than one material layer, for example, a first material layer and a second material layer, the fabrication method can include removing the second material layer of substrate 110. When substrate 110 includes more than one material layer, an electrically insulating material layer is typically positioned between electrically conductive material layer stack 120 and the other layer(s) of substrate 110.

Referring back to FIGS. 2-10, vertical transistor device 100 begins with a substrate 110 that is non-conductive, either in whole or in part with respect to at least the portion of the substrate that is adjacent to conductive material layer stack 120 (the top of the substrate 110 as shown in FIG. 2), such that electrical shorting of transistor 100 does not occur. Conductive material layer stack 120 is applied to (for example, deposited or coated) onto substrate 110. Conductive material layer stack 120 functions as the gate of transistor 100. An electrically insulating material layer 140 is applied to conductive material layer stack 120 and is patterned.

Substrate 110 does not interact appreciably with any of the material layers or the processing methods. Substrate 110, often referred to as a support, can be used for supporting the thin film transistor (also referred to as a TFT) during manufacturing, testing, or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a "non-participating support" herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly (oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate the thin film transistor. If flexibility is not a concern, then the substrate can be a wafer or sheet made of materials including glass and silicon.

In some example embodiments, substrate 110 can include a temporary support or support material layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The electrically conductive material layer stack 120, commonly referred to as a conductor, can be any suitable conductive material that permits conductive material layer stack 120 to function as a gate 125 (shown in FIG. 1). A variety of gate materials known in the art are also suitable, including metals, degenerately doped semiconductors, conductive polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3, 4-ethylenedioxythiophene)/poly(styrene sulfonate) (PE-DOT:PSS). In addition, alloys, combinations, and multilayers of these materials can be used. The gate 125 electrode (layer stack 120) can be deposited on substrate 110 using chemical vapor deposition, sputtering, evaporation, doping, or solution processed methods.

Figure 2:
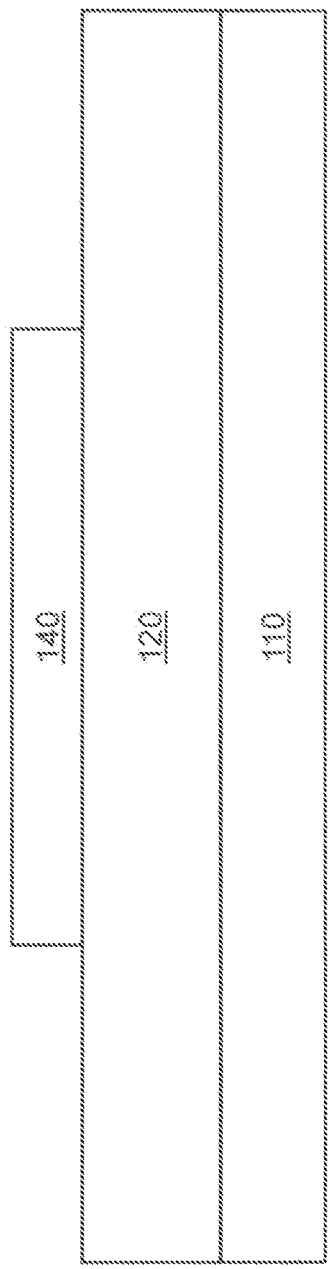
FIGS. 2 through 10 are schematic cross sectional views of process steps associated with an example embodiment of a method of producing the vertical transistor shown in FIG. 1.

The thickness (the vertical direction as shown in FIG. 2) of the gate electrode can vary, typically from about 100 to about 10000 nm. As the thickness defines the gate length, the thickness is usually thicker than twice the thickness of the conformally coated materials in order to reduce the likelihood of electrical shorting in subsequent applied material layers.

Electrically insulating material layer 140 can be a conventional photoresist known in the art such as a polymeric positive acting resist or a negative resist. Electrically insulating material layer 140 can be exposed through a mask with a low resolution (>0.1 mm) alignment to substrate 110 and developed to yield a pattern of resist. In another example embodiment, the pattern of electrically insulating material layer 140 is accomplished using a printing process, for example, flexography or inkjet printing, which prints the resist directly in a patterned manner without using a mask. Referring back to FIG. 3, a schematic cross sectional view of transistor 100 material layers after material processing are shown. In FIG. 3, electrically conductive material layer stack 120, is etched around patterned electrically insulating material layer 140 to create a reentrant profile 170. The etchant can be any organic or inorganic material which, when used in a suitable etching process, removes the conductive material without substantially attacking electrically insulating material layer 140 and provides the reentrant profile 170. The etching process can be done in multiple steps, with steps involving different selectivity to the layers of the electrically conductive material layer stack 120, in order to create the reentrant profile. The etchant can have little impact on substrate 110. As such, the selected etchant or etchants often depend on the substrate 110 and the conductor stack 120.

It is possible for the profile of the patterned electrically insulating material layer 140 to change when heated. For example and referring back to FIG. 5, it is possible for a resist material to flow, keeping the same width of line but changing the pattern to one with a radius of curvature on the free surface. This can happen from deliberate anneal steps, or coincidentally with a different process step that takes place at elevated temperature, as could happen for example during the deposition of the second electrically insulating layer 150.

In some cases it may be more preferable to etch patterned electrically insulating material layer 140 to move it back from the edge of the reentrant profile 170, as illustrated in FIG. 6. The drawing shows the effect of, for instance, etching the electrically insulating material layer 140 after it has been reflowed.

Referring back to FIG. 3, at this point, if it is necessary, electrically insulating material layer 140 can be removed and replaced with another layer. Gentle cleaning can be performed on the electrically conductive material layer stack, if desired, provided that the cleaning process does not remove the reentrant profile 170. The same, or a different, electrically insulating layer can then be applied either patternwise (by any printing technique, including ink jet printing and flexography) or uniformly. If applied uniformly, the patterning of the new layer can be done by standard photolithographic processes, either directly if the electrically insulating layer is photosensitive, or by applying another resist layer.

Ultimately, a layer of electrically insulating material is positioned in contact with a portion of the electrically conductive gate stack 120 and will serve to space apart the electrically conductive gate stack 120 from the electrode which will be deposited subsequently. In general, the capacitance between two electrodes is proportional to the dielectric constant, k, of the electrically insulating material between them. Referring back to FIG. 1, a portion of the electrically insulating material between the electrode 810 and the electrode 125 is the electrically insulating material layer 140. Preferably, electrically insulating material layer 140 has a dielectric constant less than 3.9 which is understood in the art as being a low k dielectric. Suitable electrically insulating materials include organic materials, for example, photoresists and other organic polymers. Alternatively, suitable electrically insulating materials include inorganic materials, for example, fluorine-, carbon- or hydrogen-doped-silicon dioxides; or highly porous oxides such as aerogels.

Referring back to FIGS. 7 and 8, schematic cross sectional views of the semiconductor device after conformal coating of a dielectric nonconductive material, often referred to as an insulator, and a semiconductor material, respectively, are shown. Referring to FIG. 7, a dielectric nonconductive material 150 is then conformally coated using a conformal coating deposition process over substrate 110, the reentrant feature formed at the edge of conductive material layer stack 120, and the exposed portion of electrically insulating material layer 140. Applying a dielectric nonconductive material 150 using a conformal coating process helps to maintain the reentrant profile 170. The dielectric nonconductive material 150 is often referred to as the gate dielectric. It is preferable that nonconductive material 150 be a high k dielectric material which as used herein is understood to be greater than or equal to 3.9. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

Referring to FIG. 8, a semiconductor material 160 is then coated using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrode(s) 710 and electrode 810 when conductor 120 is energized, it is important that the conformally coated material be provided with a consistent or uniform thickness at least in the region where the reentrant profile 170 and the gate are located and more preferable in the areas between electrode(s) 710 and electrode 810 including the area where the reentrant profile 170 and the gate are located. A preferred process for conformally coating includes atomic layer deposition (ALD) or spatial ALD (S-ALD), a derivative of ALD. Either process, discussed in more detail below, yields a uniform thickness on a highly varying topology.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, US 2008/0166884, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The semiconductor material layer 160, often referred to as a semiconductor, can be any type of semiconductor provided the semiconductor material can be deposited or coated using a conformal coating process such as ALD or S-ALD. Examples of suitable semiconductor materials include zinc oxide, zinc chalcogenides, indium tin oxides, gallium indium tin oxides, gallium tin oxides, cadmium chalcogenides, gallium pnictides, aluminum nictides, germanium, and silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor material layer has been applied using a process such as ion implantation and thermal diffusion.

Referring back to FIGS. 9 and 10, schematic cross sectional views of the semi-conductor device during, and after directional coating of an electrically conductive material are shown. After semiconductor material layer 160 has been deposited, electrode(s) 710 and electrode 810 are formed by depositing second electrically conductive material layer 700 (and third electrically conductive material layer 800 in some example embodiments) using a directional (or line-of-sight) deposition process which does not deposit or coat material into the reentrant profile 170. This can also be referred to as a nonconformal deposition process. Examples of suitable directional deposition processes include thermal evaporation, electron beam evaporation, sputtering, or laser ablation. The active channel gap between electrode(s) 710 and electrode 810 is maintained by the shadow cast by the reentrant profile 170 of the electrically conductive material layer stack 120. Electrode(s) 710 and Electrode 810 function as the source or drain of transistor 100.

The drain and the source of transistor 100 can be selected from either of electrode 710 and electrode 810 with the selection typically being based on the application and the characteristics of the contemplated device. As shown in FIG. 1, electrode 810 is on the top of the mesa formed by conductor 120 while electrode(s) 710 is not. As such, electrode 710 and electrode 810 are on different planes. Any necessary interconnects can be accomplished using conventional techniques that are well known in the art, for example, material layer leveling and via feed-through.

Substrate 110, electrically conductive material layer stack 120, second dielectric nonconductive material layer 150, semiconductor material layer 160, electrode(s) 710, or combinations thereof can include one or more layers provided the functional aspect of the layer remains unchanged. Additional layers, for example, leveling layers, barrier layers, adhesion layer, can be included in the semiconductor device as long as the function of the layers described above is preserved.

The present invention is suitable for use with other types of vertical transistors including, for example, those described in U.S. Pat. No. 7,923,313 B1, issued to Tutt et al., on Apr. 12, 2011 which is incorporated by reference in its entirety herein; or U.S. Pat. No. 7,985,684 B1, issued to Tutt et al., on Jul. 26, 2011 which is incorporated by referenced in its entirety herein.

The present invention is also suitable for use with the transistor described below with reference to FIG. 11 which is described in more detail in commonly-assigned, U.S. patent application Ser. No. 12/986,241, filed on Jan. 7, 2011, and entitled "TRANSISTOR INCLUDING MULTI-LAYER REENTRANT PROFILE", the disclosure of which is incorporated by reference in its entirety herein.

Figure 11:
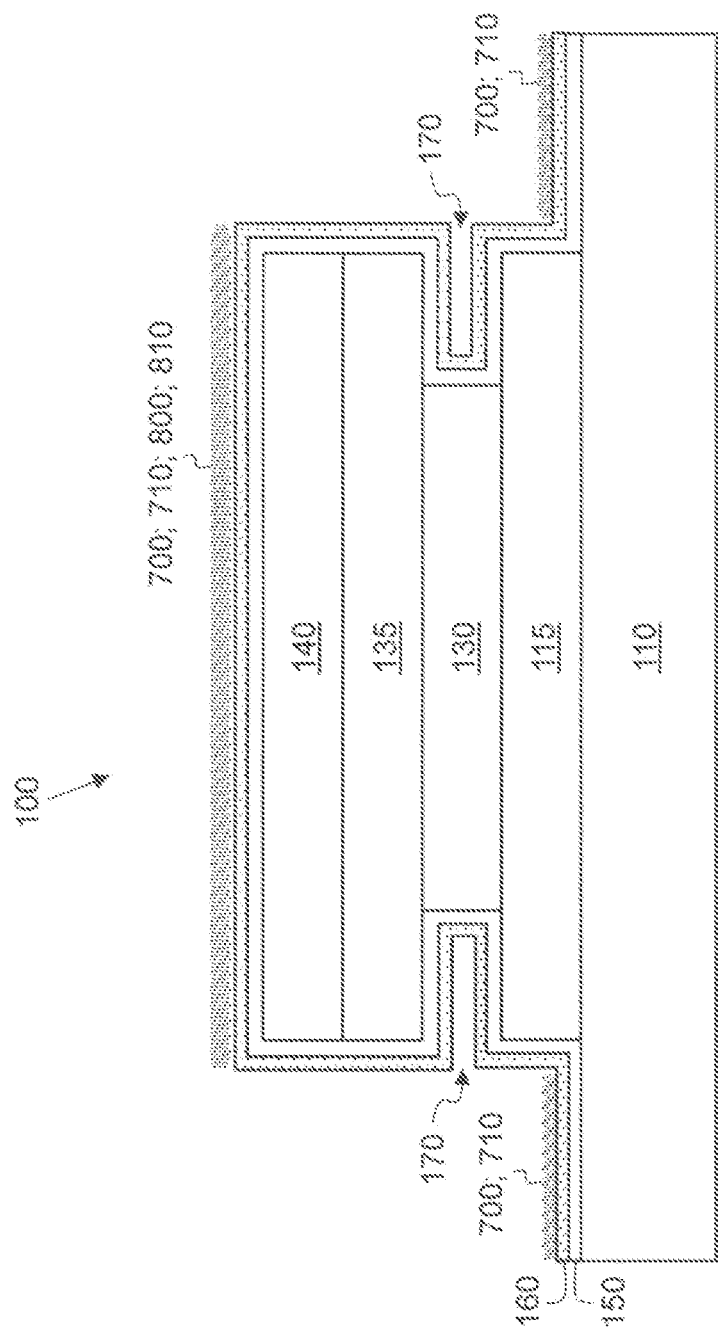
FIG. 11 is a schematic cross sectional view of another example embodiment of a vertical transistor made in accordance with the present invention.

Referring to FIG. 11, a schematic cross sectional view of another example embodiment of vertical transistor 100 is shown. Transistor 100 includes a substrate 110 and an electrically conductive material layer stack 120 that includes a first electrically conductive material layer 115, a second electrically conducting material layer 130, and a third electrically conducting material layer 135. Transistor 100 also includes an electrically insulating material layer 140, another electrically insulating material layer 150, a semiconductor material layer 160, an electrode or electrodes 710, and an electrode 810.

Conductive layer 115 is positioned between substrate 110 and second conducting layer 130. A first surface of conductive layer 115 contacts a first surface of substrate 110 while a second surface of conductive layer 115 contacts a first surface of second electrically conductive layer 130. Second conductive layer 130 is positioned between first conducting layer 115 and third conducting layer 135. A first surface of second conductive layer 130 contacts a second surface of first conducting layer 115 while a second surface of conductive layer 130 contacts a first surface of third electrically conductive layer 135. Electrically insulating material layer 140 is positioned over third electrically conductive layer 135. Substrate 110, often referred to as a support, can be rigid or flexible.

Third conducting layer 135, second conductive layer 130, first conductive layer 115, or combinations thereof is appropriately dimensioned (or sized), positioned, or dimensioned and positioned relative to at least one other layer or substrate to create a reentrant profile 170 in transistor 100. As such, it can be said that at least a portion of one or more of third conducting layer 135, second conductive layer 130, and first conductive layer 115 defines the reentrant profile 170 of transistor 100. The reentrant profile 170 shields at least some of second conductive layer 130 from material deposited (or coated) using a directional (or line of sight) deposition (or coating) process. The reentrant profile 170 allows at least some of the second conductive layer 130 to be accessible to material deposited using a conformal deposition (or coating) process.

As shown in FIG. 11, the reentrant profile 170 is defined by portions of one or both of third electrically conducting material layer 135 and second electrically conductive material, layer 130. Third electrically conductive layer 135 is sized and positioned to extend beyond or overhang second conductive layer 130 such that third conducting layer 135 creates a reentrant profile 170 relative to second conductive layer 130. Alternatively stated, second conductive layer 130 is sized and positioned to end (in both the left and right directions as shown in FIG. 11) before third conducting layer 135 ends such that second conductive layer 130 creates a reentrant profile 170 relative to third conductive layer 135.

The first conducting layer 115 extends out (in both the left and right directions as shown in FIG. 11) from the second conducting layer 130 to provide electrical conduction under the reentrant profile 170. This configuration of transistor 100 provides switching of the semiconductor layer 160 in the regions under the reentrant profile closest to the substrate 110 that would otherwise be left ungated and act as a series resistor.

Insulating material layer 150 conforms to the reentrant profile 170 of transistor 100. Insulating material layer 150 includes first and second surfaces with the first surface being in contact with portions of exposed surfaces of third conducting layer 135, second conductive layer 130, first conductive layer 115, and substrate 110. Semiconductor material layer 160 conforms to the reentrant profile 170 of transistor 100. Semiconductor layer 160 includes first and second surfaces with the first surface being in contact with the second surface of insulating layer 150. Distinct (or separate, different) portions of the second surface of semiconductor layer 160 are in contact with electrode(s) 710 and electrode 810.

Electrode(s) 710 includes another (a fourth) electrically conductive material layer 700. Electrode 800 includes yet another (a fifth) electrically conductive material layer 800. Electrode(s) 710 and electrode 810 are positioned spaced apart from each other at different locations of transistor 100. The fourth and fifth electrically conductive material layers 700, 800 can be the same material layer. When this is done, electrode(s) 710 and electrode 810 are included in distinct discontinuous portions of the same electrically conductive material layer 700.

Electrically conductive material layers, 115, 130 and 135 function as the gate of transistor 100. In some example embodiments of transistor 100, electrode(s) 710 functions as the drain of transistor 100 and electrode 810 functions as the source of transistor 100. In other example embodiments of transistor 100, electrode(s) 710 functions as the source and electrode 810 functions as the drain.

The semiconductor device is actuated in the following manner. After transistor 100 is provided, a voltage is applied between (the fourth) electrically conductive material layer 700 (electrode(s) 710) and (the fifth) electrically conductive material layer 800 (electrode 810). A voltage is also applied to the gate of transistor 100, for example, first electrically conductive material layer 115, to electrically connect the fourth electrically conductive material layer 700 (electrode(s) 710) and the fifth electrically conductive material layer 800 (electrode 810). As electrically conductive material layer 115 is in contact with electrically conductive material layer 130 and electrically conductive material layer 135, applying a voltage to electrically conductive material layer 115 is considered equivalent to applying a voltage to either or both of electrically conductive material layer 130 and electrically conductive material layer 135 or all three of the electrically conductive material layers.

The reentrant profile 170 of transistor 100 allows a dimension of the semiconductor material channel of the transistor to be associated, at least in part, with the thickness of the second conductive layer 130, which functions as a portion or all of the gate of transistor 100. Advantageously, this architecture of the present invention reduces reliance on high resolution or very fine alignment features during the manufacture of transistors that include small channels.

The experimental results discussed below were obtained using a transistor 100 configuration like the one described with reference to FIG. 11.

EXPERIMENTAL RESULTS

A 140 nm layer of aluminum material layer was sputter-coated on a 62.5 mm square glass substrate, covered with a 460 nm molybdenum material layer was coated deposited via sputtering, and that in turn was covered with another 140 nm layer of aluminum material sputter-coated. A patterned material layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 75 seconds on a Cobilt mask aligner (Cobilt model CA-419 from Computervision Corporation, Sunnyvale, Calif.), using only the edges of the glass substrate as a low resolution or crude alignment. The sample was then developed for 60 seconds in Microposit MF-319 developer (Rohm and Haas Electronic Materials LLC, Marlborough, Mass.) and rinsed for 5 minutes in DI water.

The exposed regions of the top conductive aluminum layer were removed in hot phosphoric acid. The now exposed region of the conductive molybdenum was plasma etched with 0.3 torr SF6 at 200 W using a Technics plasma etcher. The exposed region of the bottom aluminum layer was etched in hot phosphoric acid.

The substrate was then conformally coated with a material layer 10 nm thick of aluminum oxide at 200 degrees Celsius using the S-ALD process described in U.S. Pat. No. 7,413, 982 and the S-ALD apparatus described in U.S. Pat. No. 7,456,429 with the organo-metallic precursors trimethyl aluminum and water with an inert carrier gas of nitrogen.

The substrate was then coated with a 10 nm material layer of zinc oxide at 200 degrees Celsius using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 50 nm thick.

Figure 12:
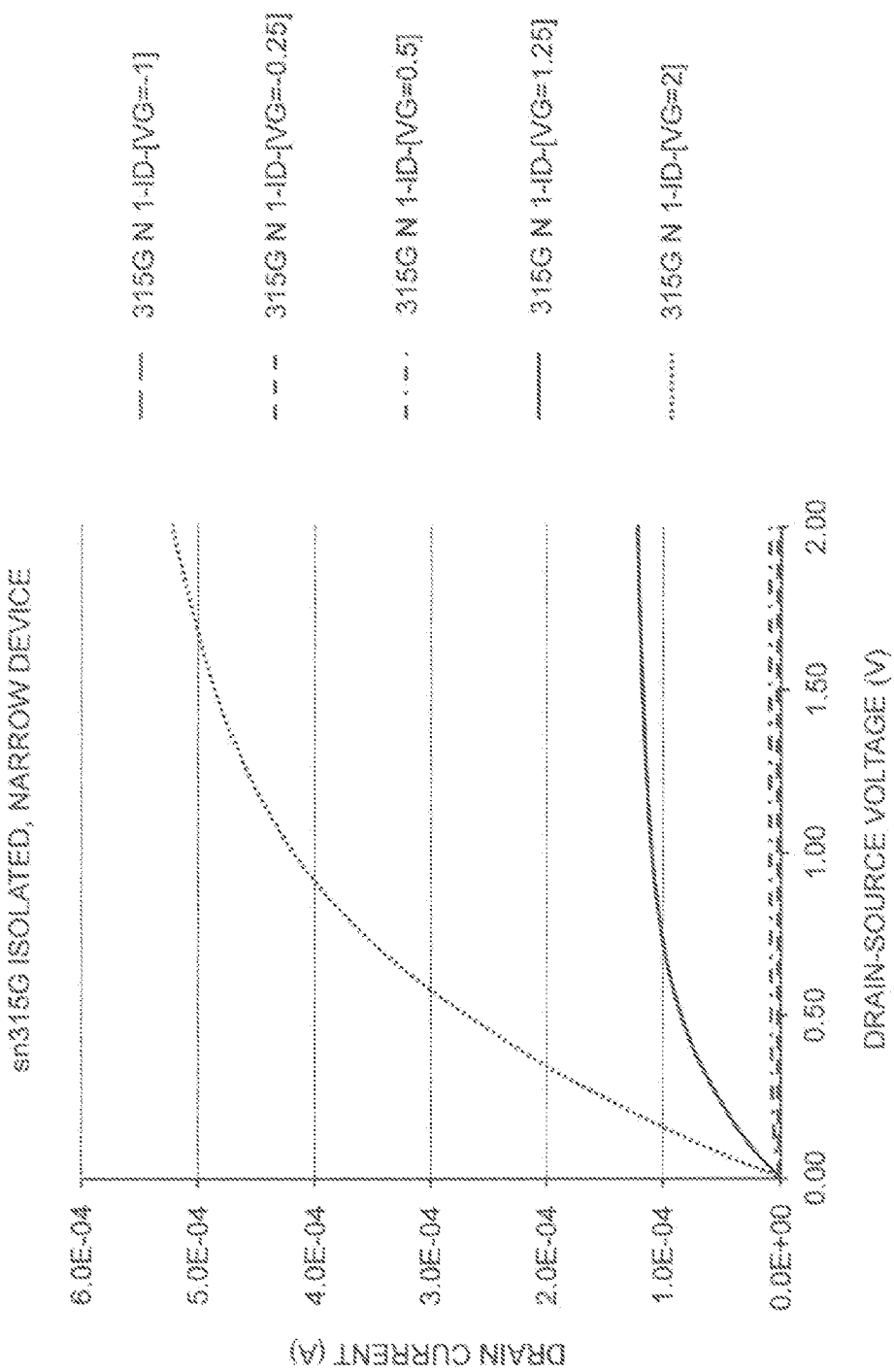
FIG. 12 is a graph showing performance $I_d$-$V_d$ curve characteristics for the transistor shown in FIG. 11.

Testing of the transistor was accomplished by using a probe station to contact two different portions of the aluminum electrodes and the aluminum-molybdenum-aluminum metal stack which functions as the gate. Referring to FIG. 12, a graph showing performance $I_d$-$V_d$ curve characteristics for the transistor is shown. As can be seen in FIG. 12, the drain current versus drain voltage is very responsive to the gate voltage.

Figure 13:
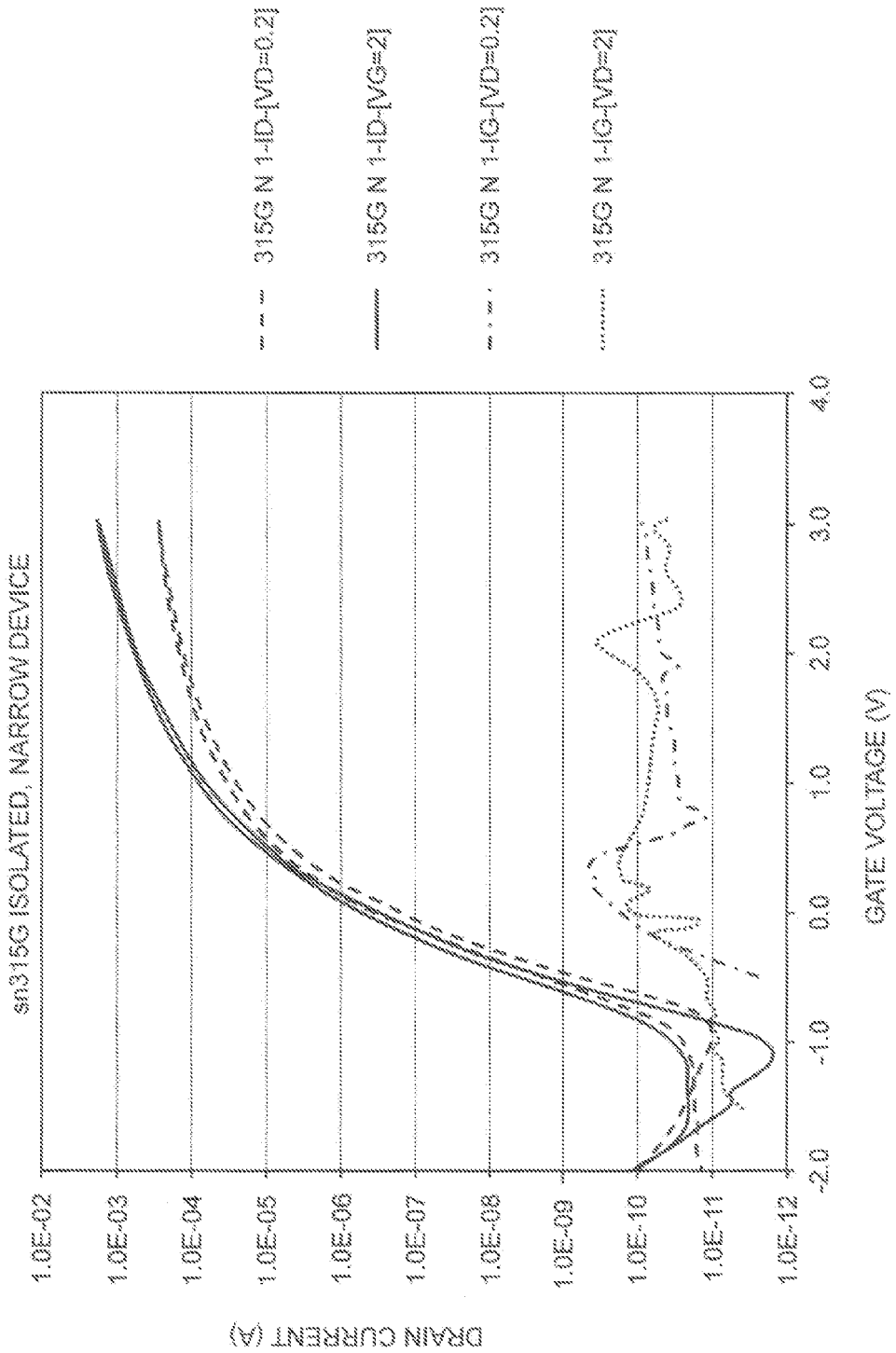
FIG. 13 is a graph showing performance transfer characteristics for the transistor shown in FIG. 11.

Referring to FIG. 13, a graph showing performance transfer characteristics for the transistor is shown. As can be seen in FIG. 12, the drain current responds well to the gate voltage, ranging from a small current of about $10^{-11}$ amps at a gate of −3 volts to 500 microamps at a gate of 10 volts for a drain voltage of 1.2 volts. The gate current, which has very little leakage at all gate voltages, is also shown The invention has been described in detail with particular reference to certain preferred embodiments thereof, but it will be understood that variations and modifications can be effected within the scope of the invention.

PARTS LIST

100 transistor
110 substrate
115 electrically conductive material layer
120 electrically conductive material layer stack
125 gate
130 electrically conductive material layer
135 electrically conductive material layer
140 electrically insulating material layer
150 a dielectric nonconductive material layer
160 semiconductor; semiconductor material layer
170 reentrant profile
700 electrically conductive material layer
710 electrode(s); source or drain
800 electrically conductive material layer
810 electrode; drain or source
900 directional (nonconformal) deposition arrow

The invention claimed is:

1. A transistor comprising:
a substrate;
an electrically conductive material layer stack positioned on the substrate, the electrically conductive material layer stack including a reentrant profile;
a first electrically insulating material layer positioned in contact with a first portion of the electrically conductive material layer stack on a surface of the first electrically conductive material layer stack opposite the substrate;
a second electrically insulating material layer conformally positioned in contact with the first electrically insulating layer, and conformally positioned in contact with a second portion of the electrically conductive material layer stack, and conformally positioned in contact with at least a portion of the substrate;
a semiconductor material layer conformally positioned in contact with the second electrically insulating layer; and
a first electrode and a second electrode in contact with distinct portions of the semiconductor material layer, the first electrode located on the electrically conductive material layer stack, the second electrode not located on the electrically conductive material layer stack, the first electrically insulating material layer separating the first electrode from the electrically conductive material layer stack.

2. The transistor of claim 1, wherein the second portion of the electrically conductive material layer stack includes the reentrant profile of the electrically conductive material layer stack.

3. The transistor of claim 2, wherein the first electrically insulating material layer does not extend beyond the first portion of the electrically conductive material layer stack.

4. The transistor of claim 1, wherein the electrically conductive material layer stack includes a single material layer with the reentrant profile being in the single material layer.

5. The transistor of claim 1, wherein the electrically conductive material layer stack includes a plurality of material layers with the reentrant profile being in one or a combination of the plurality of material layers.

6. The transistor of claim 1, wherein the first electrically insulating material layer is a low k dielectric material layer.

7. The transistor of claim 6, wherein the low k dielectric material layer includes an organic material.

8. The transistor of claim 7, wherein the organic material includes one of a photoresist and a polymer.

9. The transistor of claim 6, wherein the second electrically insulating material layer is a high k dielectric material layer.

10. The transistor of claim 1, first electrically insulating material layer including a cross sectional profile, wherein the cross sectional profile of the first electrically insulating material layer includes a radius of curvature.

11. The transistor of claim 1, wherein the second electrically insulating material layer is a high k dielectric material layer.

12. The transistor of claim 1, wherein the first electrically insulating material layer does not extend beyond the first portion of the electrically conductive material layer stack.

13. A method of actuating a semiconductor device comprising:
providing a transistor including:
a substrate;
an electrically conductive material layer stack positioned on the substrate, the electrically conductive material layer stack including a reentrant profile;
a first electrically insulating material layer positioned in contact with a first portion of the electrically conductive material layer stack on a surface of the first electrically conductive material layer stack opposite the substrate;
a second electrically insulating material layer conformally positioned in contact with the first electrically insulating layer, and conformally positioned in contact with a second portion of the electrically conductive material layer stack, and conformally positioned in contact with at least a portion of the substrate;
a semiconductor material layer conformally positioned in contact with the second electrically insulating material layer;
a first electrode in contact with the semiconductor material layer, the first electrode located on the electrically conductive material layer stack, the first electrically insulating material layer separating the first electrode from the electrically conductive material layer stack;
a second electrode in contact with a distinct portion of the semiconductor material layer when compared to the first electrode, the second electrode not located on the electrically conductive material layer stack;
applying a voltage between the first electrode and the second electrode; and applying a voltage to the electrically conductive material layer stack to electrically connect the first electrode and the second electrode.

14. The method of claim 13, the first electrode and the second electrode being different portions of the same material layer, wherein applying a voltage between the first electrode and the second electrode includes applying a voltage to different discontinuous portions of the same material layer.

* * * * *